(12) United States Patent
Hall et al.

(10) Patent No.: US 8,536,007 B2
(45) Date of Patent: Sep. 17, 2013

(54) NON-VOLATILE MEMORY CELL AND LOGIC TRANSISTOR INTEGRATION

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/402,426

(22) Filed: Feb. 22, 2012

(65) Prior Publication Data

US 2013/0214346 A1 Aug. 22, 2013

(51) Int. Cl.
*H01L 21/8246* (2006.01)

(52) U.S. Cl.
USPC ............... 438/268; 257/E21.662; 438/257; 438/237

(58) Field of Classification Search
USPC .. 438/237, 238, 257–267, 268; 257/E21.662
See application file for complete search history.

(56) References Cited

U.S. PATENT DOCUMENTS

| | | | |
|---|---|---|---|
| 6,777,761 | B2 | 8/2004 | Clevenger et al. |
| 7,208,793 | B2 | 4/2007 | Bhattacharyya |
| 7,544,990 | B2 | 6/2009 | Bhattacharyya |
| 7,795,091 | B2 | 9/2010 | Winstead et al. |
| 8,334,198 | B2 | 12/2012 | Chen et al. |

OTHER PUBLICATIONS

U.S. Appl. No. 12/915,726, Shroff, M., et al, "Non-Volatile Memory and Logic Circuit Process Integration", filed Oct. 29, 2010.
U.S. Appl. No. 13/077,491, Shroff, M., et al, "Non-Volatile Memory and Logic Circuit Process Integration", filed Mar. 31, 2011.
U.S. Appl. No. 13/077,501, Shroff, M., et al, "Non-Volatile Memory and Logic Circuit Process Integration", filed Mar. 31, 2011.
U.S. Appl. No. 13/307,719, Shroff, M., et al, "Logic and Non-Volatile Memory (NVM) Integration", filed Nov. 30, 2011.
U.S. Appl. No. 13/343,331, Shroff, M., et al, "Non-Volatile Memory (NVM) and Logic Integration", filed Jan. 4, 2012.
Mao, et al., "Nonvolatile memory devices with high density ruthenium nanocrystals", Appl. Phys. Lett.93, 242102, http://apl.aip.org/resource/1/applab/v93/i24/p242102_s1?isAuthorized=no, 2008.
Mao, et al, "Nonvolatile Memory Characteristics with Embedded High Density Ruthenium Nanocrystals", http://iopscience.iop.org/0256-307X/26/5/056104, Chinese Physics Letters, vol. 26, No. 5, 2009.
Chen, et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.

(Continued)

*Primary Examiner* — Savitr Mulpuri
(74) *Attorney, Agent, or Firm* — James L. Clingan, Jr.; Joanna G. Chiu

(57) ABSTRACT

A first conductive layer and an underlying charge storage layer are patterned to form a control gate in an NVM region. A first dielectric layer is formed over the control gate. A sacrificial layer is formed over the first dielectric layer and planarized. A patterned masking layer is formed over the sacrificial layer which includes a first portion which defines a select gate location laterally adjacent the control gate in the NVM region and a second portion which defines a logic gate in a logic region. Exposed portions of the sacrificial layer are removed such that a first portion remains at the select gate location. A second dielectric layer is formed over the first portion and planarized to expose the first portion. The first portion is removed to result in an opening at the select gate location. A gate dielectric layer and a select gate are formed in the opening.

18 Claims, 8 Drawing Sheets

(56) References Cited

OTHER PUBLICATIONS

Pei, et al., MOSFET Nonvolatile Memory with High-Density Cobalt-Nanodots Floating Gate and HfO2 High-k Blocking Dielectric, IEEE Transactions on Nanotechnology, vol. 10, No. 3, May 2011, pp. 528-531.

Kang, et al., "Improved characteristics for Pd nanocrystal memory with stacked HfAlO-siO2 tunnel layer", Sciencedirect.com, Solid-State Electronics, vol. 61, Issue 1, Jul. 2011, pp. 100-105, http://www.sciencedirect.com/science/article/pii/S0038110111000803.

U.S. Appl. No. 13/442,142, Hall et al., Office Action—Ex Parte Quayle—mailed Apr. 4, 2013.

U.S. Appl. No. 13/789,971, Hall et al., Office Action—Notice of Allowance—mailed May 15, 2013.

US 8,536,007 B2

NON-VOLATILE MEMORY CELL AND LOGIC TRANSISTOR INTEGRATION

BACKGROUND

1. Field

This disclosure relates generally to non-volatile memories, and more specifically, to integrating non-volatile memories with logic transistors on the same integrated circuit.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration provides for important features to be formed at stages in the process that allows for flexibility in the choice of materials for critical dielectrics and choice of materials for storage layers such as being able to choose between floating gate and nanocrystals as well as choose from among several nanocrystal materials. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
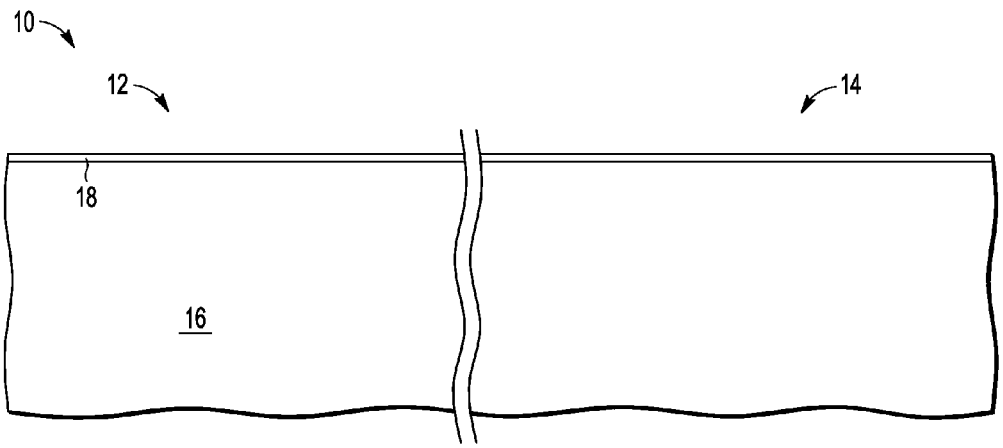
FIG. 1 is a cross section of a semiconductor device at a stage in processing according to an embodiment.

Shown in FIG. 1 is a semiconductor device 10 having a semiconductor substrate 16, an NVM region 12 in and over a portion of substrate 16, a logic region 14 in and over a portion of substrate 16, and a hard mask layer 18 over substrate 16. In and over the same substrate 16, there may be other regions as well. A process for forming a single logic transistor and a single NVM cell will be shown in subsequent figures and are exemplary of other transistors and memory cells to be formed in those regions. Hard mask layer 18 may be oxide and may be about 100 Angstroms. Other materials and thicknesses may also be used.

Figure 2:
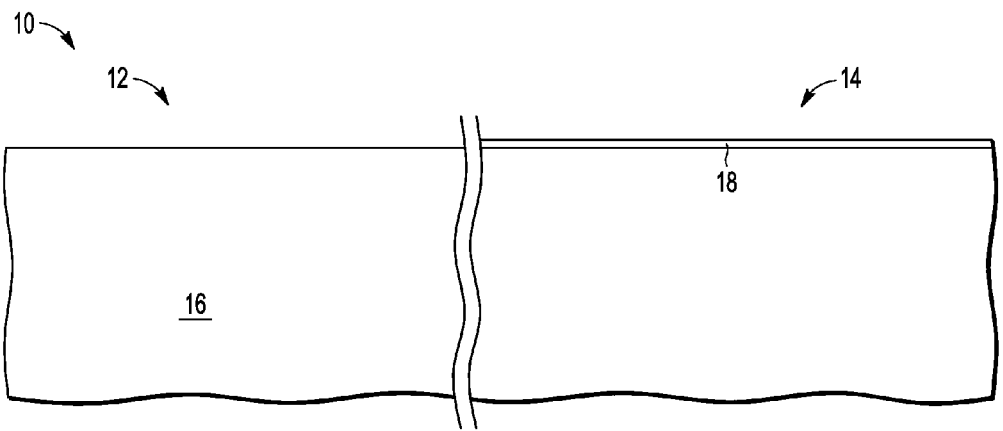
FIG. 2 is a cross section of the semiconductor device of FIG. 1 at a subsequent stage in processing.

Shown in FIG. 2 is semiconductor device 10 after removing hard mask layer 18 from NVM region 12. A mask, not shown, is used for this etch.

Figure 3:
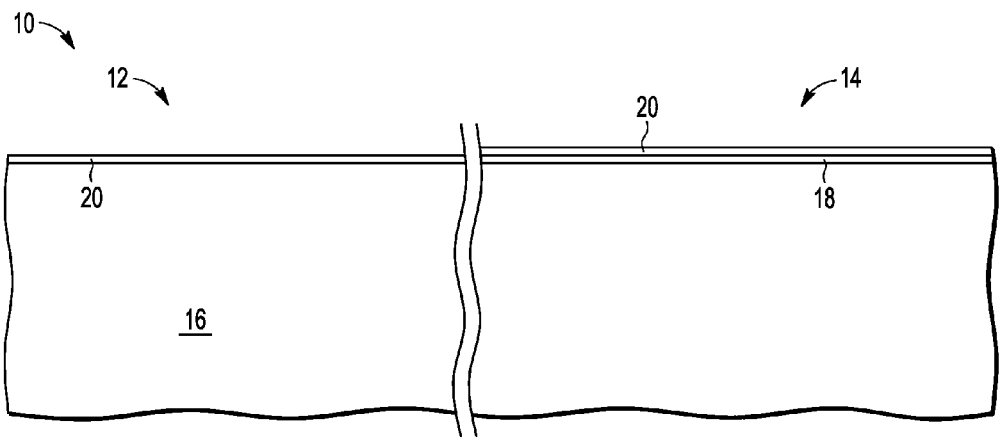
FIG. 3 is a cross section of the semiconductor device of FIG. 2 at a subsequent stage in processing.

Shown in FIG. 3 is semiconductor device 10 after depositing a charge storage layer 20 over NVM region 12 on substrate 16 and over logic region 14 on hard mask layer 18.

Figure 4:
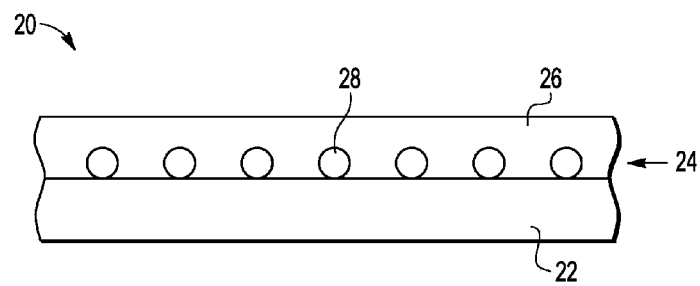
FIG. 4 is a portion of the semiconductor device shown in FIG. 3 in more detail.

Shown in FIG. 4 is charge storage layer 20 in more detail. Charge storage layer has a dielectric layer 22 on substrate 16, a plurality of nanocrystals 24 on dielectric layer 22 including an exemplary nanocrystal 28, and a dielectric layer 26 on dielectric layer 22 and on and around nanocrystals 24. Dielectric layer 22 may be a high-k dielectric which may be hafnium oxide. Dielectric layer 22 is the dielectric layer through which charge flows to and from nanocrystals 24 for program and erase as well as the gate dielectric between nanocrystals 24 and a channel. Nanocrystals are typically polysilicon but nanocrystals 24 may also be metallic. Dielectric layer 26 may be a high-k dielectric such as hafnium oxide.

Figure 5:
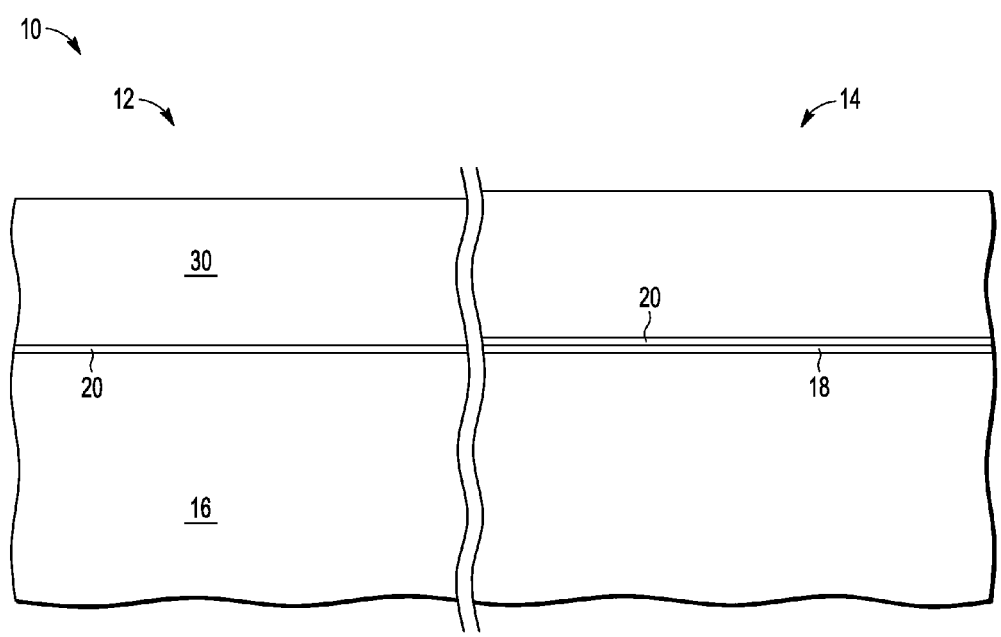
FIG. 5 is a cross section of the semiconductor device of FIG. 3 at a subsequent stage in processing.

Shown in FIG. 5 is a semiconductor device after forming a gate material 30 on charge storage layer 20 in NVM region 12 and logic region 14. Gate material 30 may have a thickness of about 1000 Angstroms. Gate material 30 may be metal which may provide a benefit over polysilicon. Polysilicon may be used as well. Gate material 30 may also be a stack of conductive materials that may include metal and polysilicon.

Figure 6:
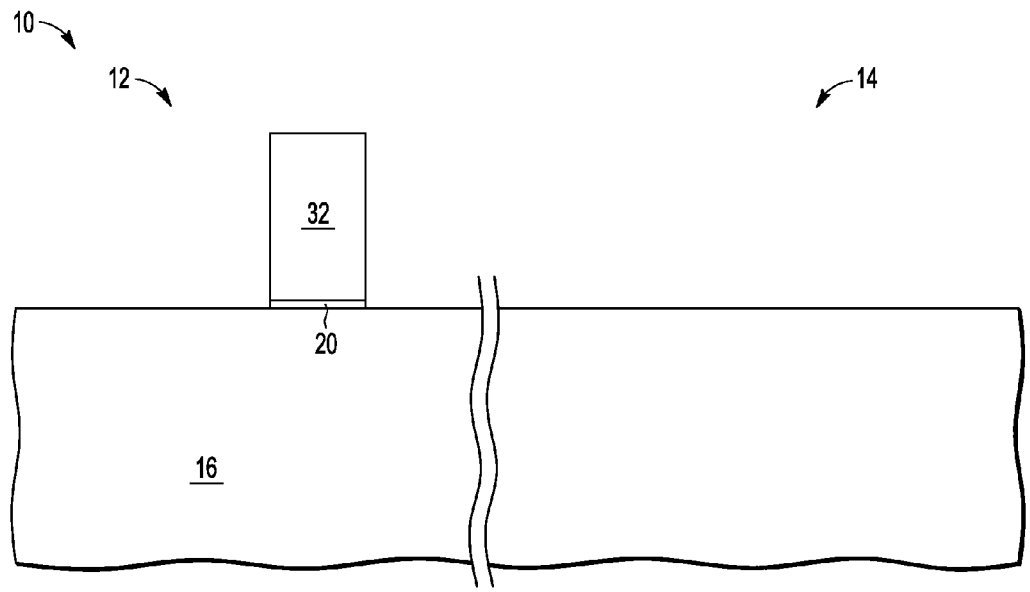
FIG. 6 is a cross section of the semiconductor device of FIG. 5 at a subsequent stage in processing.

Shown in FIG. 6 is semiconductor device 10 after etching gate material 30 and charge storage layer 20. There need not be any change to gate material 30 other than patterning it, but the result is what will be used as a functional structure, control gate 32, in NVM region 12. Gate material 30, charge storage layer 20, and hard mask layer 18 are removed from logic region 14 so that a top surface of substrate 16 will be exposed in logic region 14. The top portion of substrate 16 is also exposed in NVM region 12 except where control gate 32 is present.

Figure 7:
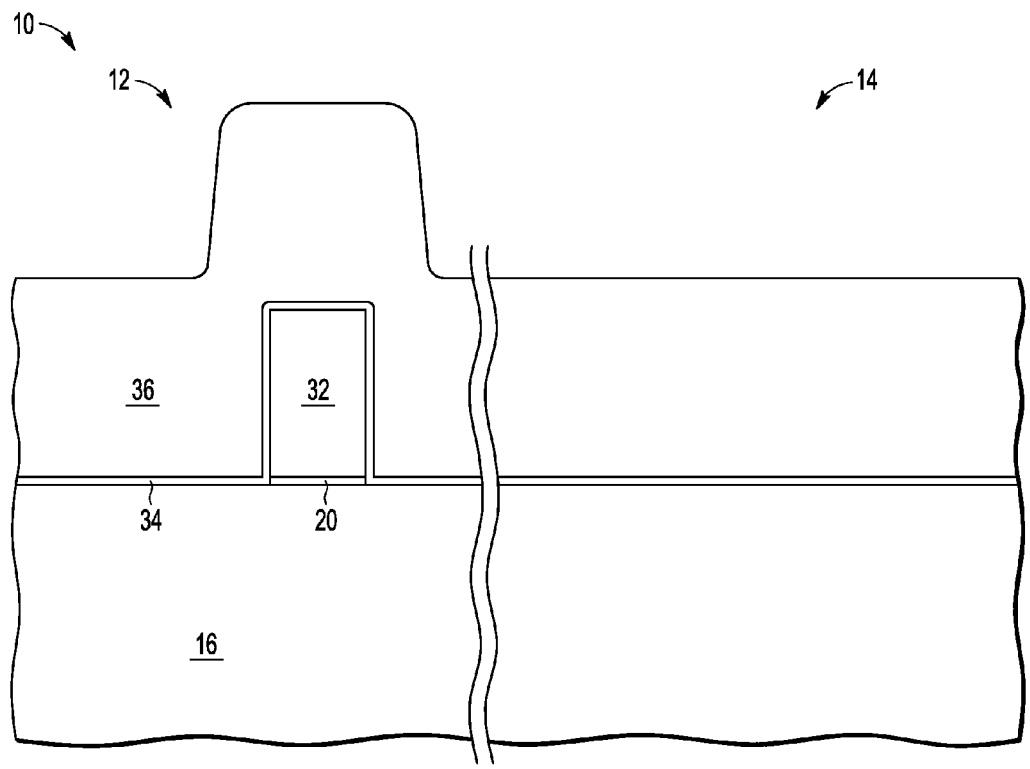
FIG. 7 is a cross section of the semiconductor device of FIG. 6 at a subsequent stage in processing.

Shown in FIG. 7 is semiconductor device 10 after forming a dielectric layer 34 on the exposed portions of NVM region 12 and logic region 14 and on control gate 32. A replacement layer 36 is formed on dielectric layer 34 in NVM region 12 and logic region 14. The lower portion of replacement layer 36 is preferably higher than, but at least as high as, dielectric layer 34 where dielectric layer 34 is over control gate 32. Replacement layer 36 is preferably nitride or polysilicon. It is completely removed eventually so it may be either conductive or insulating. Dielectric layer 34 is preferably oxide.

Figure 8:
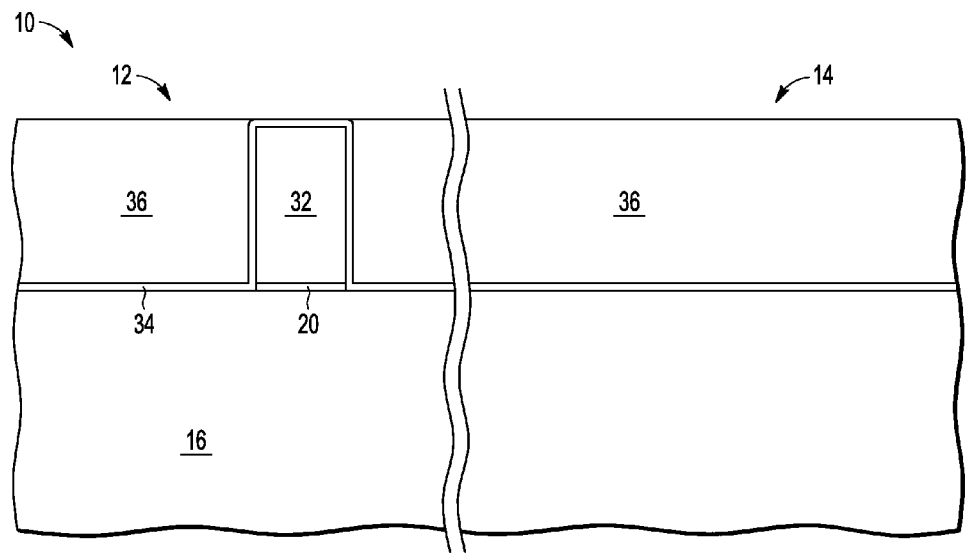
FIG. 8 is a cross section of the semiconductor device of FIG. 7 at a subsequent stage in processing.

Shown in FIG. 8 is semiconductor device 10 after performing a planarization process such as chemical mechanical polishing on replacement layer 36 to leave replacement layer 36 in a planar form having a height about the same as dielectric layer 34 over control gate 32. The CMP process may be preceded by first depositing a sacrificial layer to support the protrusions and thereby reduce the likelihood of failures where the protrusions are.

Figure 9:
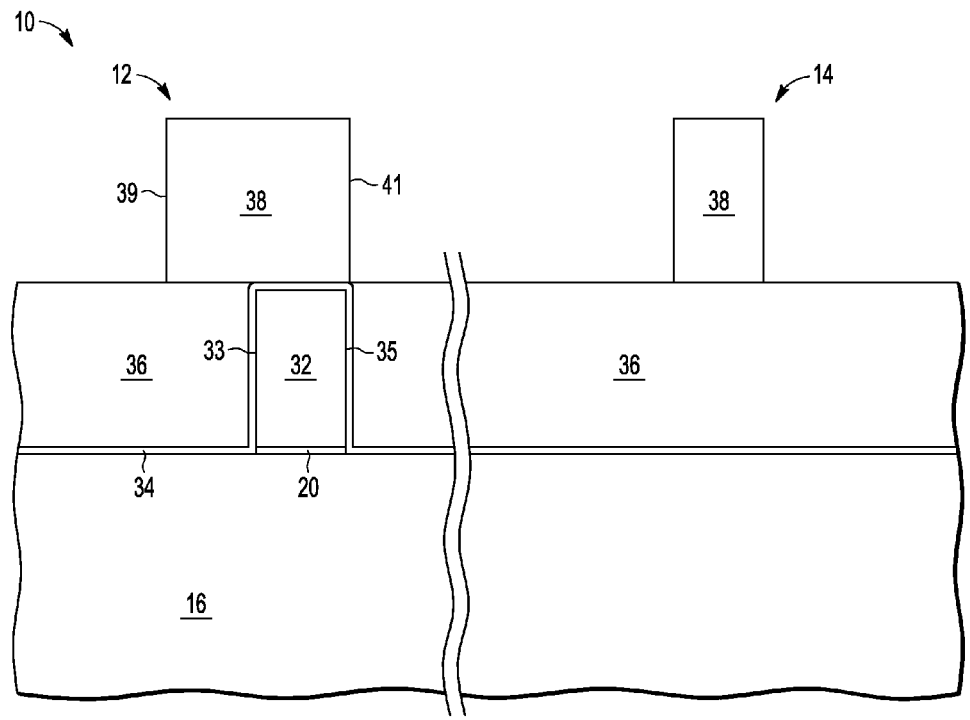
FIG. 9 is a cross section of the semiconductor device of FIG. 8 at a subsequent stage in processing.

Shown in FIG. 9 is semiconductor device 10 after forming patterned photoresist 38 which has a first portion in NVM region 12 over control gate 32 that has a first sidewall 39 extending away from a first sidewall 33 of control gate 32 for defining a dummy gate that will subsequently be replaced by a conductive material that will be used as a select gate. The first portion of patterned photoresist 38 in NVM region 12 has a second sidewall 41 substantially aligned to dielectric 34 where dielectric 34 is along a second sidewall 35 of control gate 32. Second sidewall 35 of control gate 32 is opposite first sidewall 33 of control gate 32. The horizontal thickness of dielectric 34 along the sidewalls of control gate 32 is preferably at least twice the alignment tolerance for the second sidewall 41 of photoresist 38 in NVM region 12 so that second sidewall 41 of photoresist 38 in NVM region 12 is neither over control gate 32 nor over replacement layer 36 but only over gate dielectric 34 along the second sidewall 35 of control gate 32. Patterned photoresist 38 has a second portion in logic region 14 that will be used to define a gate of a logic transistor.

Figure 10:
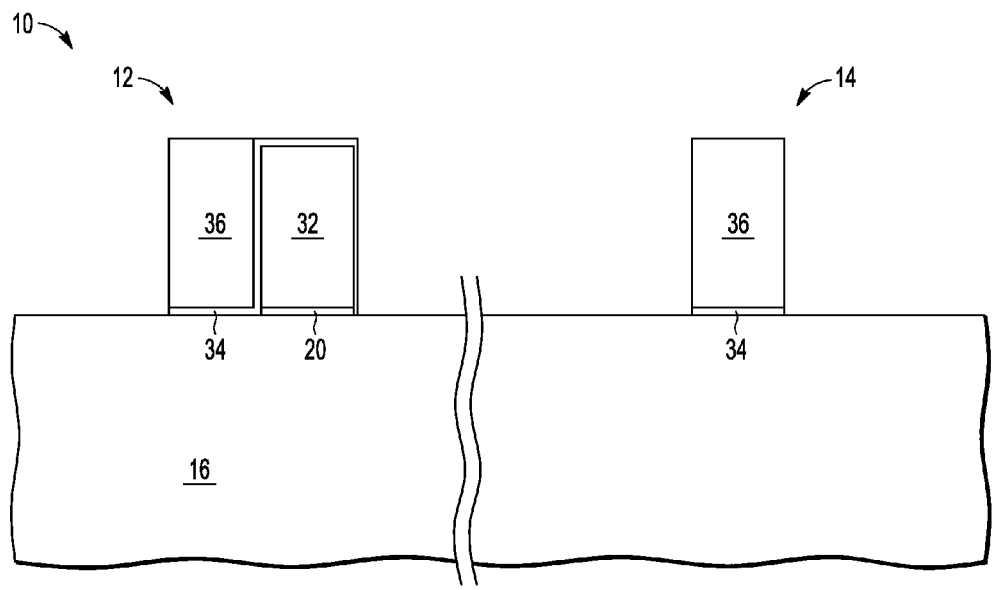
FIG. 10 is a cross section of the semiconductor device of FIG. 9 at a subsequent stage in processing.

Shown in FIG. 10 is semiconductor device 10 after performing an etch using patterned photoresist 38 as a mask leaving a first portion of replacement layer 36 adjacent to control gate 32 in NVM region 12 and a second portion of replacement layer 36 in logic region 14. Also removed is gate dielectric 34 that was not under patterned photoresist 38. Dielectric 34 remains over control gate 32. The first and second portions of replacement layer 36 will be replaced by gate material.

Figure 11:
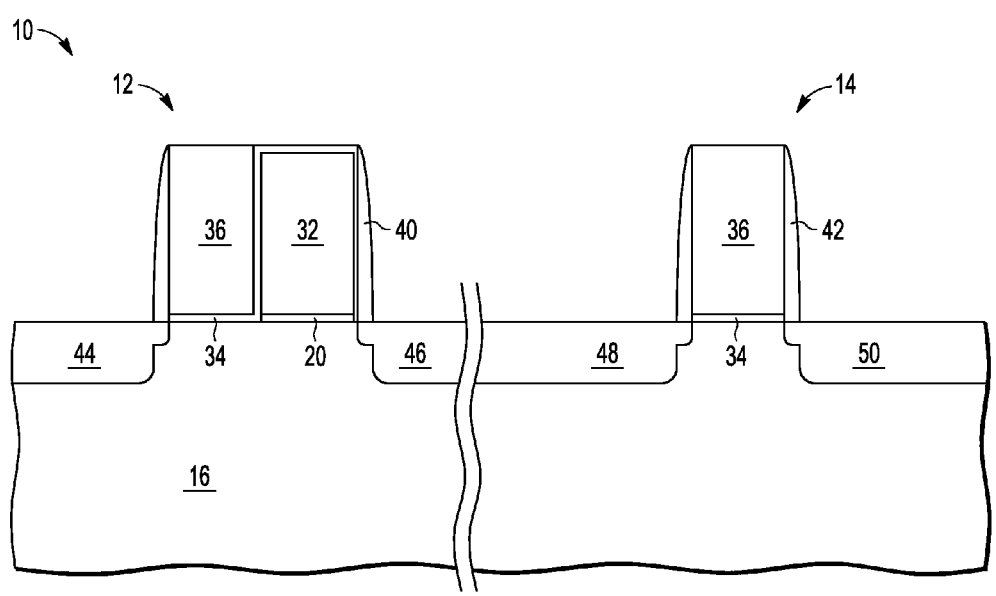
FIG. 11 is a cross section of the semiconductor device of FIG. 10 at a subsequent stage in processing.

Shown in FIG. 11 is semiconductor device 10 after forming sidewall spacers and performing implants in typical fashion for forming transistors resulting in a sidewall spacer 40 around the first portion of replacement layer 36 and control gate 32, a source/drain region 44 in substrate 16 substantially aligned to a first sidewall of the first portion of replacement layer 36, a source/drain region 46 substantially aligned to the second sidewall of control gate 32, a sidewall spacer 42 around the second portion of replacement layer 36, a source/drain region 48 substantially aligned to a first sidewall of the second portion of replacement layer 36, and a source/drain region 50 substantially aligned to a second sidewall of the second portion of replacement layer 36. If the first and second portions of replacement layer 36 were of gate material, there would be a completed NVM cell with the first portion of replacement layer 36 being a select gate and a completed logic transistor with the second portion of replacement layer 36 being a gate of the logic transistor.

Figure 12:
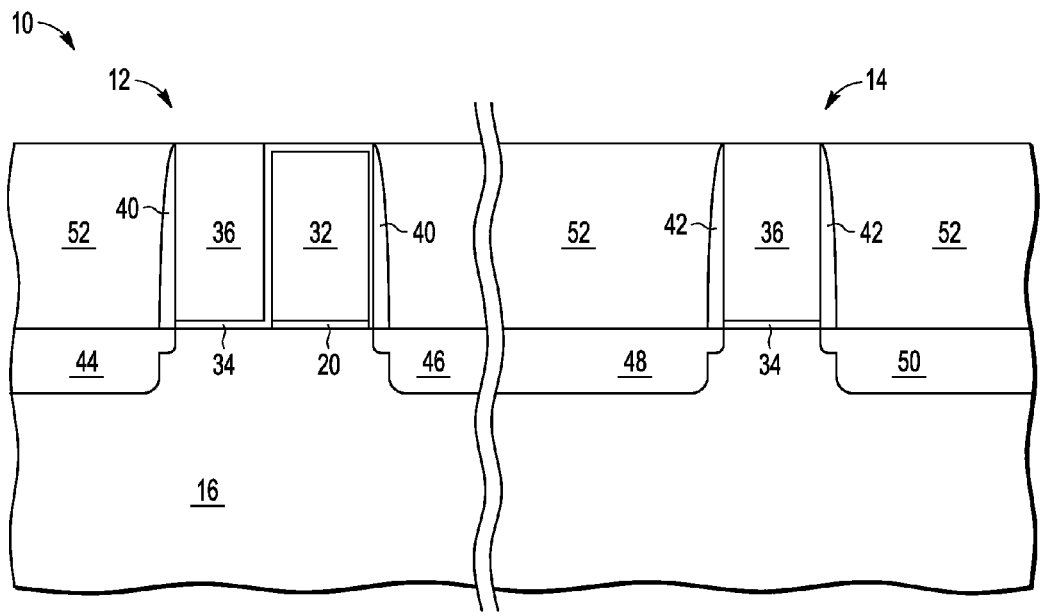
FIG. 12 is a cross section of the semiconductor device of FIG. 11 at a subsequent stage in processing.

Shown in FIG. 12 is semiconductor device 10 after forming an interlayer dielectric (ILD) 52 by deposition followed by CMP. FIG. 12 thus shows ILD 52 having portions around sidewall spacers 40 and 42. The CMP results in top surfaces of both portions of replacement layer 36 being exposed.

Figure 13:
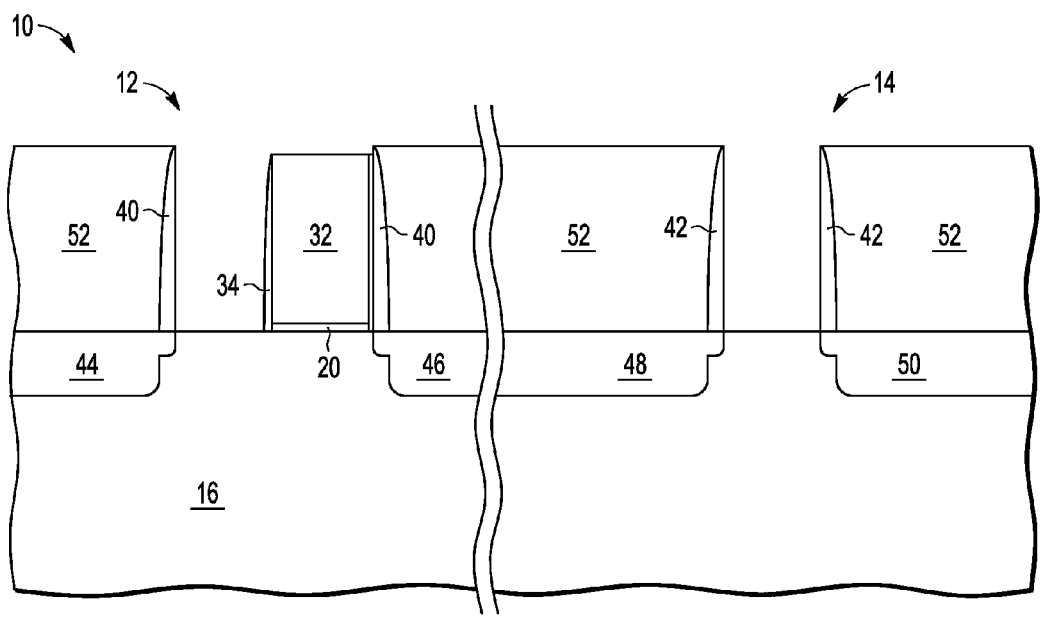
FIG. 13 is a cross section of the semiconductor device of FIG. 12 at a subsequent stage in processing.

Shown in FIG. 13 is semiconductor device 10 after removing both portions of replacement layer 36. This may be achieved without a mask. Control gate 32 is protected by dielectric layer 34 while both portions of replacement layer 36 are removed by etching. After removing both portions of replacement layer 36, dielectric layer 34 is removed from substrate 16 to expose substrate 16 for formation of a gate dielectric for transistors to be formed in both regions where both portions of replacement layer 36 have been removed. At this point, dielectric layer 34, where it is along a sidewall of control gate 32 where replacement layer 36 had been removed, may be thinned to reduce a distance between control gate 32 and the select gate that is going to be formed. The thickness of dielectric layer 34 is related to the alignment tolerance of the positioning of the portions of patterned photoresist 38 as shown in FIG. 9. Thus, dielectric layer 34 may be thicker than desired for the sidewall of control gate 32 in FIG. 13. Thus, the thickness may be reduced as deemed beneficial. Further, portions of replacement layer 36 may instead be selectively removed using a photoresist patterning step to provide, for example, different gate stacks for logic and NVM select gates, or for example, between N-channel and P-channel logic gates.

Figure 14:
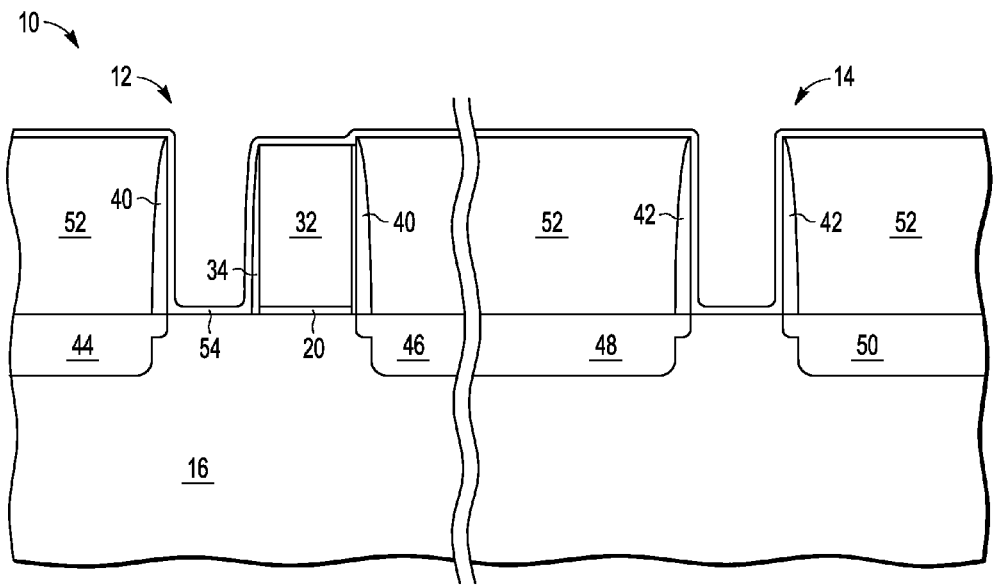
FIG. 14 is a cross section of the semiconductor device of FIG. 13 at a subsequent stage in processing.

Shown in FIG. 14 is semiconductor device 10 after forming a gate dielectric 54 over all of the exposed surfaces. This may be a high-k dielectric.

Figure 15:
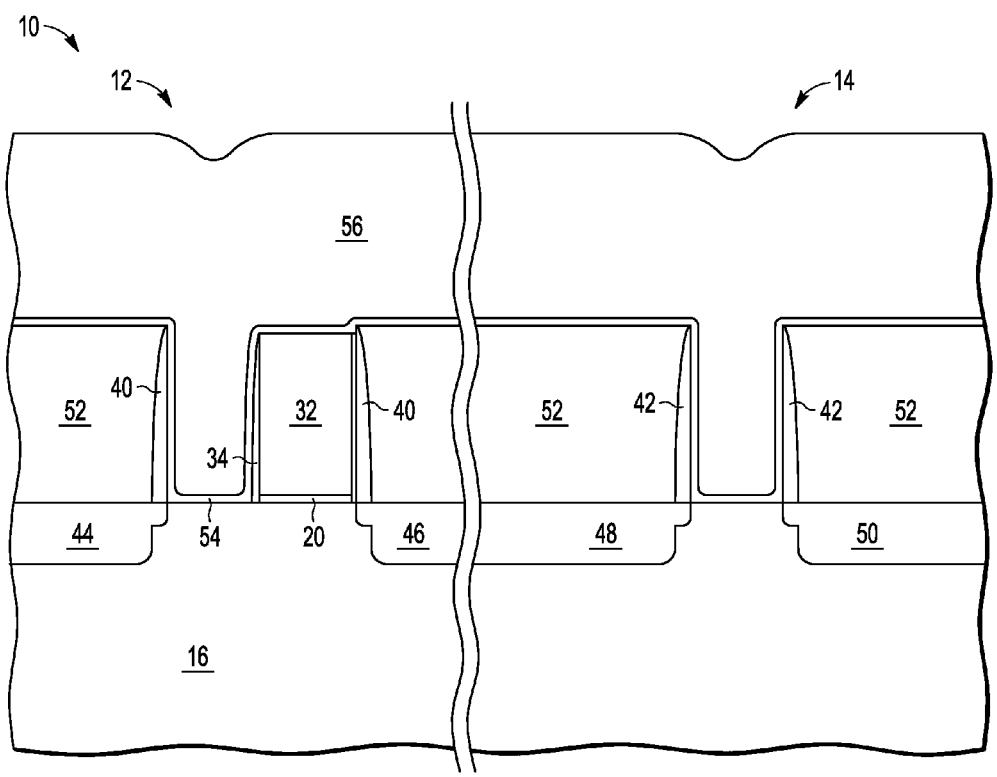
FIG. 15 is a cross section of the semiconductor device of FIG. 14 at a subsequent stage in processing.

Shown in FIG. 15 is semiconductor device 10 after forming a gate material 56 that fills openings formed by removing both portions of replacement layer 36 as shown FIG. 13. Gate material 56 may be metal or polysilicon or some combination of metal and polysilicon. Gate material 56 may be optimized for logic and select gate purposes and independent of what is best for a control gate.

Figure 16:
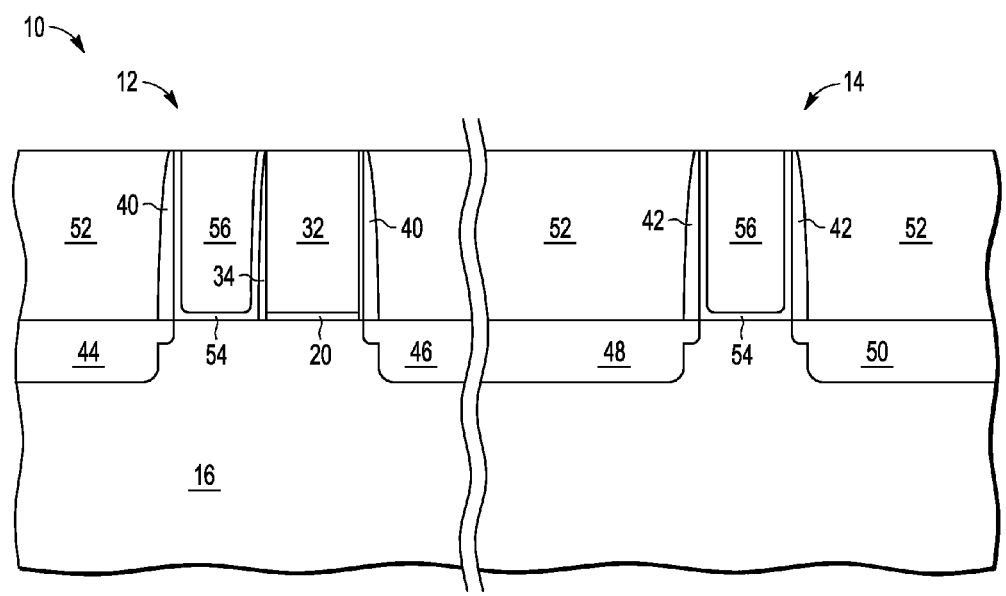
FIG. 16 is a cross section of the semiconductor device of FIG. 15 at a subsequent stage in processing.

Shown in FIG. 16 is semiconductor device 10 after performing CMP. The result is the select gate formed from a portion of gate material 56 in NVM region 12 adjacent to control gate 32 and a logic gate formed in logic region 14. The CMP process, while retaining its planarizing effect, preferably continues so as to reduce the height of control gate 32. The lowering of the height of control gate 32 has the effect of removing the top portion of dielectric layer 34 so that the remaining thickness of dielectric layer 34 is substantially uniform in the region between the select gate formed from the portion of gate material 56 in NVM region 12 and control gate 32.

Thus an efficient manner of forming an NVM memory cell and a logic transistor is achieved in which the gate dielectrics can be high-k, the gates can be metal, and the storage layer can be nanocrystals, including metal nanocrystals.

By now it should be appreciated that there has been provided a method of making a logic transistor in a logic region of a substrate and a non-volatile memory (NVM) cell in an NVM region of the substrate. The method includes forming a charge storage layer over the substrate in the NVM region and the logic region. The method further includes forming a first conductive layer over the charge storage layer in the NVM region and the logic region. The method further includes patterning the first conductive layer and the charge storage layer to form a control gate in the NVM region and to remove the first conductive layer and the charge storage layer from the logic region. The method further includes forming a first dielectric layer over the substrate and the control gate in the NVM region and over the substrate in the logic region. The method further includes forming a sacrificial layer over the first dielectric layer in the NVM region and the logic region. The method further includes planarizing the sacrificial layer, wherein the first dielectric layer comprises a sidewall portion located along a sidewall of the control gate, between the control gate and the sacrificial layer. The method further includes forming a patterned masking layer in the NVM region and the logic region, wherein the patterned masking layer comprises a first masking portion formed over the first sacrificial layer and the control gate in the NVM region and a second masking portion over the first sacrificial layer in the logic region, wherein the first masking portion defines a select gate location laterally adjacent the control gate in the NVM region and the second masking portion defines a logic gate location in the logic region. The method further includes using the patterned masking layer to remove exposed portions of the sacrificial layer, wherein a first portion of the sacrificial layer remains at the select gate location and a second portion of the sacrificial layer remains at the logic gate location. The method further includes forming a second dielectric layer in the NVM region and the logic region, wherein the second dielectric layer is formed over the first portion of the sacrificial layer, the control gate, and the second portion of the sacrificial layer. The method further includes planarizing the second dielectric layer to expose the first portion of the sacrificial layer, the control gate, and the second portion of the sacrificial layer. The method further includes removing the first portion of the sacrificial layer to result in a first opening at the select gate location and the second portion of the sacrificial layer to result in a second opening at the logic gate location. The method further includes forming a gate dielectric layer over the second dielectric layer and within the first and second openings. The method further includes forming a select gate within the first opening and a logic gate (56) within the second opening. The method may have a further characterization by which the step of planarizing the sacrificial layer exposes the first dielectric layer located on the control gate, and wherein the step of forming the patterned masking layer is performed such that the first masking portion is directly over the control gate and a first edge of the first masking portion extends laterally from the control gate onto the first sacrificial layer to define the select gate location laterally adjacent the control gate in the NVM region. The method may have a further characterization by which the step of forming the patterned masking layer is performed such that a second edge of the first masking portion, opposite the first edge of the first masking portion, is formed directly on the sidewall portion of the first dielectric layer. The method may have a further characterization by which the step of forming the patterned masking layer is performed such that a second edge of the first masking portion, opposite the first edge of the first masking portion, is aligned to a center of the sidewall portion of the first dielectric layer, wherein the center corresponds to a center point of a line which extends between the control gate and the sacrificial layer and is substantially perpendicular to sidewalls of the control gate and sacrificial layer. The method may have a further characterization by which the step of forming the first dielectric layer is performed such that a thickness of the sidewall portion of the first dielectric layer is in a range of 60 to 150 Angstroms. The method may have a further characterization by which the step of removing the first portion and the second portion of the sacrificial layer is performed such that at least a portion of the sidewall portion of the first dielectric layer remains. The method may have a further characterization by which after the step of removing the first portion and the second portion of the sacrificial layer, performing an isotropic etch of the first dielectric layer to thin the at least a portion of the sidewall portion. The method may have a further characterization by which the step of forming the select gate is characterized in that, after the select gate is formed, a portion of the gate dielectric layer and a portion of the first dielectric layer are located between the select gate and the control gate. The method may have a further characterization by which after the step of using the patterned masking layer to remove exposed portions of the sacrificial layer and prior to the step of forming the second dielectric layer in the NVM region and the logic region, wherein the method further includes forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions and forming a third source/drain region in the substrate laterally adjacent a first sidewall of the second portion of the sacrificial layer and a fourth source/drain region in the substrate laterally adjacent a second sidewall of the second portion of the sacrificial layer. The method may have a further characterization by which after the step of using the patterned masking layer to remove exposed portions of the sacrificial layer and prior to the step of forming the second dielectric layer in the NVM region and the logic region wherein the method further includes forming a first sidewall spacer surrounding outer sidewalls of the first portion of the sacrificial layer and the control gate and a second sidewall spacer surrounding the second portion of the sacrificial layer. The method may further include prior to the step of forming the charge storage layer, forming a masking layer over the substrate in the logic region, wherein the charge storage layer is formed on the substrate in the NVM region and on the masking layer in the logic region and prior to the step of forming the first dielectric layer, removing the masking layer. The method may have a further characterization by which the step of forming the charge storage layer includes forming a bottom dielectric layer, forming nanocrystals over the bottom dielectric layer, and forming a top dielectric layer over the bottom dielectric layer and over and around the nanocrystals. The method may have a further characterization by which forming the bottom dielectric layer is characterized in that the bottom dielectric layer comprises a dielectric material having a high dielectric constant and forming the nanocrystals is characterized in that the nanocrystals comprise a metal. The method may have a further characterization by which the step of forming the select gate and the logic gate is characterized in that the select gate and logic gate are formed from a same metal layer.

Also disclosed is a method of making a logic transistor in a logic region of a substrate and a non-volatile memory (NVM) cell in an NVM region of the substrate. The method includes forming a nanocrystal stack layer over the substrate in the NVM region and the logic region. The method further includes forming a first conductive layer over the nanocrystal stack layer in the NVM region and the logic region. The method further includes patterning the first conductive layer and the nanocrystal stack layer to form a control gate in the NVM region and to remove the first conductive layer and the nanocrystal stack layer from the logic region. The method further includes forming a first dielectric layer over the substrate and the control gate in the NVM region and over the substrate in the logic region. The method further includes forming a sacrificial layer over the first dielectric layer in the NVM region and the logic region. The method further includes planarizing the sacrificial layer to expose the first dielectric layer located on the control gate, wherein the first dielectric layer comprises a sidewall portion located between the control gate and the sacrificial layer. The method further includes forming a patterned masking layer in the NVM region and the logic region, wherein the patterned masking layer comprises a first masking portion formed over the sacrificial layer and the control gate in the NVM region and a second masking portion over the sacrificial layer in the logic region, wherein the first masking portion is directly over the control gate, a first edge of the first masking portion extends laterally from the control gate onto the sacrificial layer to define a select gate location laterally adjacent the control gate in the NVM region, and a second edge of the first masking portion, opposite the first edge of the first masking portion, is directly on the sidewall portion and the second masking portion defines a logic gate location in the logic region. The method further includes using the patterned masking layer to remove exposed portions of the sacrificial layer, wherein a first portion of the sacrificial layer remains at the select gate location and a second portion of the sacrificial layer remains at the logic gate location. The method further includes forming a second dielectric layer in the NVM region and the logic region, wherein the second dielectric layer is formed over the first portion of the sacrificial layer, the control gate, and the second portion of the sacrificial layer. The method further includes planarizing the second dielectric layer to expose the first portion of the sacrificial layer, the control gate, and the second portion of the sacrificial layer. The method further includes removing the first portion of the sacrificial layer to result in a first opening at the select gate location and the second portion of the sacrificial layer to result in a second opening at the logic gate location. The method further includes forming a gate dielectric layer over the second dielectric layer and within the first and second openings. The method further includes forming a select gate within the first opening and a logic gate within the second opening, wherein, after the select gate is formed, a portion of the gate dielectric layer and a portion of the first dielectric layer remains between the select gate and the control gate. The method may have a further characterization by which the step of forming the first dielectric layer is performed such that a thickness of the sidewall portion of the first dielectric layer is in a range of 60 to 150 Angstroms. The method may further include after the step of removing the first portion and the second portion of the sacrificial layer, performing an isotropic etch of the first dielectric layer to thin the sidewall portion. The method may have a further characterization by which after the step of using the patterned masking layer to remove exposed portions of the sacrificial layer and prior to the step of forming the second dielectric layer in the NVM region and the logic region, the method further includes forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions, forming a third source/drain region in the substrate laterally adjacent a first sidewall of the second portion of the sacrificial layer and a fourth source/drain region in the substrate laterally adjacent a second sidewall of the second portion of the sacrificial layer, and forming a first sidewall spacer surrounding outer sidewalls of the first portion of the sacrificial layer and the control gate and a second sidewall spacer surrounding the second portion of the sacrificial layer.

Disclosed also is a non-volatile memory (NVM) cell that a substrate and a select gate over the substrate. The NVM cell further includes a control gate over the substrate and laterally adjacent the select gate. The NVM cell further includes a nanocrystal stack between the control gate and the substrate, wherein the nanocrystal stack comprises a bottom dielectric, a plurality of nanocrystals on the bottom dielectric, and a top dielectric on and around the plurality of nanocrystals. The NVM cell further includes a gate dielectric between the select gate and the substrate and along a first sidewall of the select gate, between the first sidewall of the select gate and a first sidewall of the control gate. The NVM cell further includes an oxide-containing layer along the first sidewall of the control gate, wherein the oxide-containing layer is between the first sidewall of the control gate and the gate dielectric that is located along the first sidewall of the select gate. The NVM cell further includes a first source/drain region in the substrate, laterally adjacent a second sidewall of the select gate, opposite the first sidewall of the select gate. The NVM cell further includes a second source/drain region in the substrate, laterally adjacent a second sidewall of the control gate, opposite the first sidewall of the control gate, wherein the select gate and the control gate are between the first and second source/drain regions. The NVM cell may have a further characterization by which the gate dielectric and at least one of the bottom dielectric and the top dielectric comprise a dielectric material having a high dielectric constant.

Although the invention is described herein with reference to specific embodiments, various modifications and changes can be made without departing from the scope of the present invention as set forth in the claims below. For example, the various dimensions may be different than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a logic transistor in a logic region of a substrate and a non-volatile memory (NVM) cell in an NVM region of the substrate, comprising:
    forming a charge storage layer over the substrate in the NVM region and the logic region;
    forming a first conductive layer over the charge storage layer in the NVM region and the logic region;
    patterning the first conductive layer and the charge storage layer to form a control gate in the NVM region and to remove the first conductive layer and the charge storage layer from the logic region;
    forming a first dielectric layer over the substrate and the control gate in the NVM region and over the substrate in the logic region;

forming a sacrificial layer over the first dielectric layer in the NVM region and the logic region;

planarizing the sacrificial layer, wherein the first dielectric layer comprises a sidewall portion located along a sidewall of the control gate, between the control gate and the sacrificial layer;

forming a patterned masking layer in the NVM region and the logic region, wherein the patterned masking layer comprises a first masking portion formed over the first sacrificial layer and the control gate in the NVM region and a second masking portion over the first sacrificial layer in the logic region, wherein:

the first masking portion defines a select gate location laterally adjacent the control gate in the NVM region; and the second masking portion defines a logic gate location in the logic region;

using the patterned masking layer to remove exposed portions of the sacrificial layer, wherein a first portion of the sacrificial layer remains at the select gate location and a second portion of the sacrificial layer remains at the logic gate location;

forming a second dielectric layer in the NVM region and the logic region, wherein the second dielectric layer is formed over the first portion of the sacrificial layer, the control gate, and the second portion of the sacrificial layer;

planarizing the second dielectric layer to expose the first portion of the sacrificial layer, the control gate, and the second portion of the sacrificial layer;

removing the first portion of the sacrificial layer to result in a first opening at the select gate location and the second portion of the sacrificial layer to result in a second opening at the logic gate location;

forming a gate dielectric layer over the second dielectric layer and within the first and second openings; and forming a select gate within the first opening and a logic gate within the second opening.

2. The method of claim 1, wherein the step of planarizing the sacrificial layer exposes the first dielectric layer located on the control gate, and wherein the step of forming the patterned masking layer is performed such that:

the first masking portion is directly over the control gate, and a first edge of the first masking portion extends laterally from the control gate onto the first sacrificial layer to define the select gate location laterally adjacent the control gate in the NVM region.

3. The method of claim 2, wherein the step of forming the patterned masking layer is performed such that a second edge of the first masking portion, opposite the first edge of the first masking portion, is formed directly on the sidewall portion of the first dielectric layer.

4. The method of claim 2, wherein the step of forming the patterned masking layer is performed such that a second edge of the first masking portion, opposite the first edge of the first masking portion, is aligned to a center of the sidewall portion of the first dielectric layer, wherein the center corresponds to a center point of a line which extends between the control gate and the sacrificial layer and is substantially perpendicular to sidewalls of the control gate and sacrificial layer.

5. The method of claim 1, wherein the step of forming the first dielectric layer is performed such that a thickness of the sidewall portion of the first dielectric layer is in a range of 60 to 150 Angstroms.

6. The method of claim 1, wherein the step of removing the first portion and the second portion of the sacrificial layer is performed such that at least a portion of the sidewall portion of the first dielectric layer remains.

7. The method of claim 6, further comprising:

after the step of removing the first portion and the second portion of the sacrificial layer, performing an isotropic etch of the first dielectric layer to thin the at least a portion of the sidewall portion.

8. The method of claim 1, wherein the step of forming the select gate is characterized in that, after the select gate is formed, a portion of the gate dielectric layer and a portion of the first dielectric layer are located between the select gate and the control gate.

9. The method of claim 1, wherein after the step of using the patterned masking layer to remove exposed portions of the sacrificial layer and prior to the step of forming the second dielectric layer in the NVM region and the logic region, the method further comprises:

forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions; and forming a third source/drain region in the substrate laterally adjacent a first sidewall of the second portion of the sacrificial layer and a fourth source/drain region in the substrate laterally adjacent a second sidewall of the second portion of the sacrificial layer.

10. The method of claim 9, wherein after the step of using the patterned masking layer to remove exposed portions of the sacrificial layer and prior to the step of forming the second dielectric layer in the NVM region and the logic region, the method further comprises:

forming a first sidewall spacer surrounding outer sidewalls of the first portion of the sacrificial layer and the control gate and a second sidewall spacer surrounding the second portion of the sacrificial layer.

11. The method of claim 1, further comprising:

prior to the step of forming the charge storage layer, forming a masking layer over the substrate in the logic region, wherein the charge storage layer is formed on the substrate in the NVM region and on the masking layer in the logic region; and prior to the step of forming the first dielectric layer, removing the masking layer.

12. The method of claim 1, wherein the step of forming the charge storage layer comprises:

forming a bottom dielectric layer;

forming nanocrystals over the bottom dielectric layer; and forming a top dielectric layer over the bottom dielectric layer and over and around the nanocrystals.

13. The method of claim 12, wherein forming the bottom dielectric layer is characterized in that the bottom dielectric layer comprises a dielectric material having a high dielectric constant and forming the nanocrystals is characterized in that the nanocrystals comprise a metal.

14. The method of claim 1, wherein the step of forming the select gate and the logic gate is characterized in that the select gate and logic gate are formed from a same metal layer.

15. A method of making a logic transistor in a logic region of a substrate and a non-volatile memory (NVM) cell in an NVM region of the substrate, comprising:

forming a nanocrystal stack layer over the substrate in the NVM region and the logic region;

forming a first conductive layer over the nanocrystal stack layer in the NVM region and the logic region;

patterning the first conductive layer and the nanocrystal stack layer to form a control gate in the NVM region and to remove the first conductive layer and the nanocrystal stack layer from the logic region;

forming a first dielectric layer over the substrate and the control gate in the NVM region and over the substrate in the logic region;

forming a sacrificial layer over the first dielectric layer in the NVM region and the logic region;

planarizing the sacrificial layer to expose the first dielectric layer located on the control gate, wherein the first dielectric layer comprises a sidewall portion located between the control gate and the sacrificial layer;

forming a patterned masking layer in the NVM region and the logic region, wherein the patterned masking layer comprises a first masking portion formed over the sacrificial layer and the control gate in the NVM region and a second masking portion over the sacrificial layer in the logic region, wherein:
the first masking portion is directly over the control gate, a first edge of the first masking portion extends laterally from the control gate onto the sacrificial layer to define a select gate location laterally adjacent the control gate in the NVM region, and a second edge of the first masking portion, opposite the first edge of the first masking portion, is directly on the sidewall portion; and
the second masking portion defines a logic gate location in the logic region;

using the patterned masking layer to remove exposed portions of the sacrificial layer, wherein a first portion of the sacrificial layer remains at the select gate location and a second portion of the sacrificial layer remains at the logic gate location;

forming a second dielectric layer in the NVM region and the logic region, wherein the second dielectric layer is formed over the first portion of the sacrificial layer, the control gate, and the second portion of the sacrificial layer;

planarizing the second dielectric layer to expose the first portion of the sacrificial layer, the control gate, and the second portion of the sacrificial layer;

removing the first portion of the sacrificial layer to result in a first opening at the select gate location and the second portion of the sacrificial layer to result in a second opening at the logic gate location;

forming a gate dielectric layer over the second dielectric layer and within the first and second openings; and forming a select gate within the first opening and a logic gate within the second opening, wherein, after the select gate is formed, a portion of the gate dielectric layer and a portion of the first dielectric layer remains between the select gate and the control gate.

16. The method of claim 15, wherein the step of forming the first dielectric layer is performed such that a thickness of the sidewall portion of the first dielectric layer is in a range of 60 to 150 Angstroms.

17. The method of claim 15, further comprising:
after the step of removing the first portion and the second portion of the sacrificial layer, performing an isotropic etch of the first dielectric layer to thin the sidewall portion.

18. The method of claim 15, wherein after the step of using the patterned masking layer to remove exposed portions of the sacrificial layer and prior to the step of forming the second dielectric layer in the NVM region and the logic region, the method further comprises:
forming a first source/drain region in the substrate laterally adjacent the first portion of the sacrificial layer, a second source/drain region in the substrate laterally adjacent the control gate such that the first portion of the sacrificial layer and the control gate are located between the first and second source/drain regions;
forming a third source/drain region in the substrate laterally adjacent a first sidewall of the second portion of the sacrificial layer and a fourth source/drain region in the substrate laterally adjacent a second sidewall of the second portion of the sacrificial layer; and
forming a first sidewall spacer surrounding outer sidewalls of the first portion of the sacrificial layer and the control gate and a second sidewall spacer surrounding the second portion of the sacrificial layer.

* * * * *